(12) United States Patent
Wagoner et al.

(10) Patent No.: US 7,567,447 B2
(45) Date of Patent: Jul. 28, 2009

(54) ELECTRICAL SWITCHING DEVICE HAVING CURRENT BALANCED TRANSISTORS

(75) Inventors: Robert Gregory Wagoner, Roanoke, VA (US); Igor Berroteran, Salem, VA (US)

(73) Assignee: General Electric Company, Schenectady, NY (US)

(*) Notice: Subject to any disclaimer, the term of this patent is extended or adjusted under 35 U.S.C. 154(b) by 307 days.

(21) Appl. No.: 11/325,581

(22) Filed: Jan. 4, 2006

(65) Prior Publication Data

US 2007/0152730 A1 Jul. 5, 2007

(51) Int. Cl.
*B63H 23/24* (2006.01)

(52) U.S. Cl. .................................... 363/178; 363/21.01

(58) Field of Classification Search ............ 363/21.01, 363/178; 323/266
See application file for complete search history.

(56) References Cited

U.S. PATENT DOCUMENTS

| | | | | |
|---|---|---|---|---|
| 4,816,741 A | * | 3/1989 | Ekstrand | 323/297 |
| 4,823,247 A | * | 4/1989 | Tamoto | 363/16 |
| 6,304,462 B1 | * | 10/2001 | Balakrishnan et al. | 363/21.01 |
| 6,696,882 B1 | * | 2/2004 | Markowski et al. | 327/531 |
| 7,019,988 B2 | | 3/2006 | Fung | 363/21.01 |
| 7,023,709 B2 | | 4/2006 | Lipcsei | 363/17 |
| 2004/0109268 A1 | * | 6/2004 | Horng et al. | 361/23 |
| 2005/0073786 A1 | * | 4/2005 | Turnbull et al. | 361/93.1 |
| 2007/0164779 A1 | * | 7/2007 | Weston et al. | 326/26 |

FOREIGN PATENT DOCUMENTS

| | | |
|---|---|---|
| DE | 19726765 A1 | 1/1999 |
| EP | 1168620 A1 | 2/2002 |
| JP | 09289442 | 6/2007 |

OTHER PUBLICATIONS

European Search Report Application No. 06126831.4-2215; Dated May 30, 2007.

* cited by examiner

*Primary Examiner*—Akm E Ullah
*Assistant Examiner*—Arun Williams
(74) *Attorney, Agent, or Firm*—Cantor Colburn LLP

(57) ABSTRACT

An electrical switching device having a plurality of parallel coupled IGBTs is provided. The electrical switching device balances electrical currents in each of the IGBTs that are supplied to a load.

10 Claims, 3 Drawing Sheets

ELECTRICAL SWITCHING DEVICE HAVING CURRENT BALANCED TRANSISTORS

BACKGROUND OF THE INVENTION

Power converters utilize a plurality of transistors to source a desired amount of electrical current to a load. A problem with power converters, however, is that during transient operating conditions (e.g., turning on or turning off) of the plurality of parallel coupled transistors, the gate voltages of the plurality of transistors are not equal to one another. As a result, an electrical current being sourced by each transistor of the plurality of transistors are not equal to one another. This imbalance in electrical current between the transistors can result in degradation of the transistors and reduced output capability of the power converter.

Accordingly, the inventors herein have recognized a need for an improved electrical switching device that can balance the electrical currents sourced from multiple parallel-coupled transistors.

BRIEF DESCRIPTION OF THE INVENTION

An electrical switching device in accordance with an exemplary embodiment is provided. The electrical switching device includes a drive circuit generating a voltage signal. The electrical switching device further includes a first insulated gate bipolar transistor (IGBT) having a first gate terminal, a first collector terminal, and a first emitter terminal. The first gate terminal receives the voltage signal from the drive circuit via a first impedance circuit. The first collector terminal is electrically coupled to a voltage source. The electrical switching device further includes a second IGBT having a second gate terminal, a second collector terminal, and a second emitter terminal. The second emitter terminal is electrically coupled to the first emitter terminal. The second gate terminal receives the voltage signal from the drive circuit via a second impedance circuit. The second collector terminal is electrically coupled to the first collector terminal. The electrical switching device further includes a first resistor electrically coupled between the first gate terminal of the first IGBT and a node. The electrical switching device further includes a second resistor electrically coupled between the second gate terminal of the second IGBT and the node. When the first and second gate terminals receive the voltage signal from the drive circuit via the first and second impedance circuits, respectively, an amplitude of a first voltage between the first gate terminal and the first emitter terminal is substantially equal to a second voltage between the second gate terminal and the second emitter terminal, resulting in a first current flowing from the first emitter terminal of the first IGBT to a load to be substantially equal to a second current flowing from the second emitter terminal of the second IGBT to the load.

An electrical switching device in accordance with another exemplary embodiment is provided. The electrical switching device includes a drive circuit generating a voltage signal. The electrical switching device further includes a first IGBT having a first gate terminal, a first collector terminal, and a first emitter terminal. The first gate terminal receives the voltage signal from the drive circuit via a first impedance circuit. The first collector terminal is electrically coupled to a load. The electrical switching device further includes a second IGBT having a second gate terminal, a second collector terminal, and a second emitter terminal. The second emitter terminal is electrically coupled to the first emitter terminal. The second gate terminal receives the voltage signal from the drive circuit via a second impedance circuit. The second collector terminal is electrically coupled to the first collector terminal. The electrical switching device further includes a first resistor electrically coupled between the first gate terminal of the first IGBT and a node. The electrical switching device further includes a second resistor electrically coupled between the second gate terminal of the second IGBT and the node. When the first and second gate terminals receive the voltage signal from the drive circuit via the first and second impedance circuits, respectively, an amplitude of a first voltage between the first gate terminal and the first emitter terminal is substantially equal to a second voltage between the second gate terminal and the second emitter terminal, resulting in a first current flowing from the first emitter terminal of the first IGBT to a voltage source to be substantially equal to a second current flowing from the second emitter terminal of the second IGBT to the voltage source.

An electrical switching device in accordance with another exemplary embodiment is provided. The electrical switching device includes a drive circuit generating a voltage signal. The electrical switching device further includes a first metal oxide semi-conductor field effect transistor (MOSFET) having a first gate terminal, a first source terminal, and a first drain terminal. The first gate terminal receives the voltage signal from the drive circuit via a first impedance circuit. The first source terminal is electrically coupled to a voltage source. The electrical switching device further includes a second MOSFET having a second gate terminal, a second source terminal, and a second drain terminal. The second drain terminal is electrically coupled to the first drain terminal. The second gate terminal receives the voltage signal from the drive circuit via a second impedance circuit. The second source terminal is electrically coupled to the first source terminal. The electrical switching device further includes a first resistor electrically coupled between the first gate terminal of the first MOSFET and a node. The electrical switching device further includes a second resistor electrically coupled between the second gate terminal of the second MOSFET and the node. When the first and second gate terminals receive the voltage signal from the drive circuit via the first and second impedance circuits, respectively, an amplitude of a first voltage between the first gate terminal and the first drain terminal is substantially equal to a second voltage between the second gate terminal and the second drain terminal, resulting in a first current flowing from the first drain terminal of the first MOSFET to a load to be substantially equal to a second current flowing from the second drain terminal of the second MOSFET to the load.

An electrical switching device in accordance with another exemplary embodiment is provided. The electrical switching device includes a drive circuit generating a voltage signal. The electrical switching device further includes a first MOSFET having a first gate terminal, a first source terminal, and a first drain terminal. The first gate terminal receives the voltage signal from the drive circuit via a first impedance circuit. The first source terminal is electrically coupled to a load. The electrical switching device further includes a second MOSFET having a second gate terminal, a second source terminal, and a second drain terminal. The second drain terminal is electrically coupled to the first drain terminal. The second gate terminal receives the voltage signal from the drive circuit via a second impedance circuit. The second source terminal is electrically coupled to the first source terminal. The electrical switching device further includes a first resistor electrically coupled between the first gate terminal of the first MOSFET and a node. The electrical switching device further includes a second resistor electrically coupled between the second gate terminal of the second MOSFET and the node. When the first and second gate terminals receive the voltage signal from the drive circuit via the first and second impedance circuits, respectively, an amplitude of a first voltage between the first gate terminal and the first drain terminal is substantially equal to a second voltage between the second gate terminal and the second drain terminal, resulting in a first current flowing from the first drain terminal of the first MOSFET to a voltage source to be substantially equal to a second current flowing from the second drain terminal of the second MOSFET to the voltage source.

Other devices according to the embodiments will become or are apparent to one with skill in the art upon review of the following drawings and detailed description. It is intended that all such additional systems and methods be within the scope of the present invention, and be protected by the accompanying claims.

DETAILED DESCRIPTION OF THE INVENTION

Figure 1:
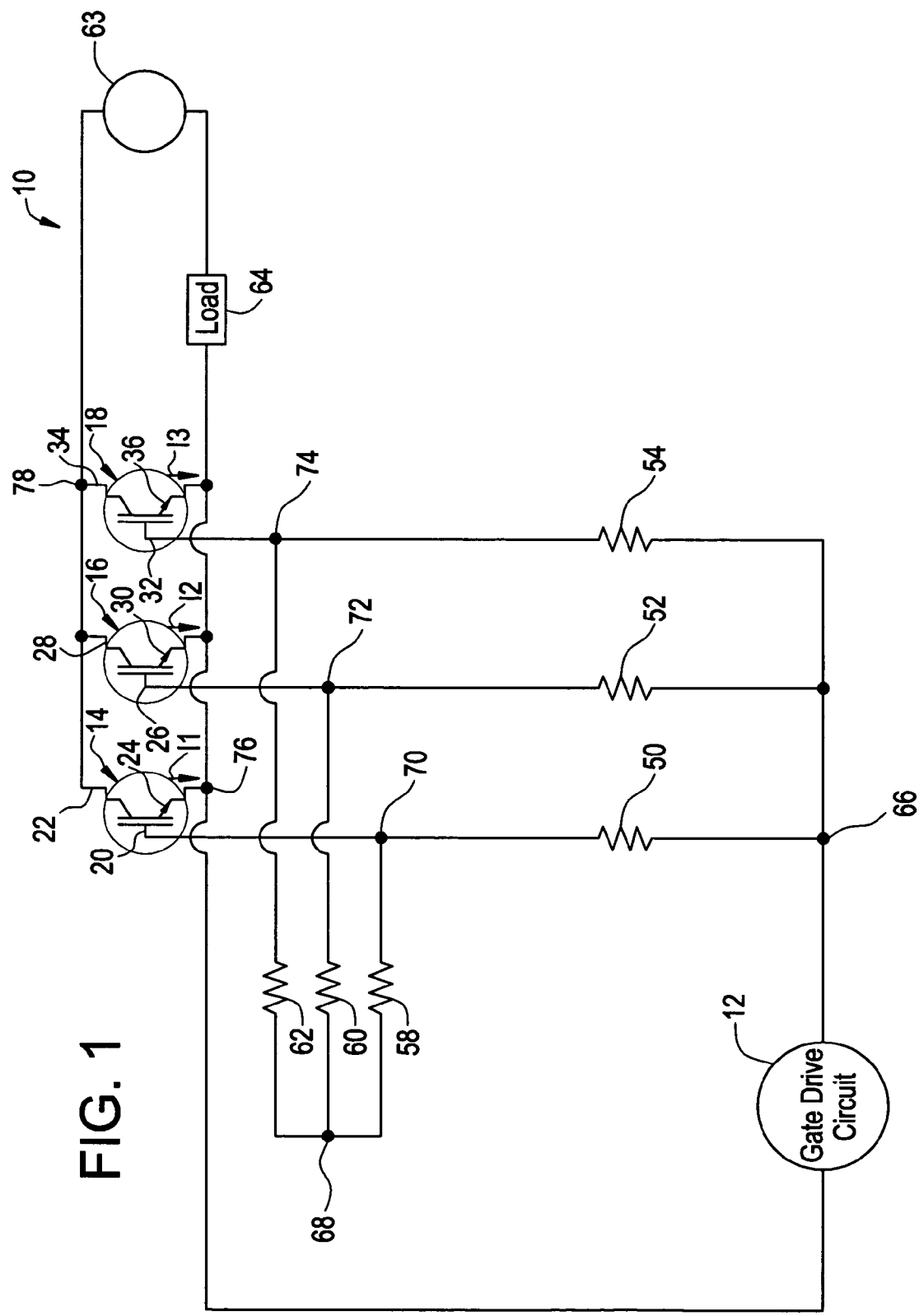
FIG. 1 illustrates an electrical switching device in accordance with an exemplary embodiment.
Figure 2:
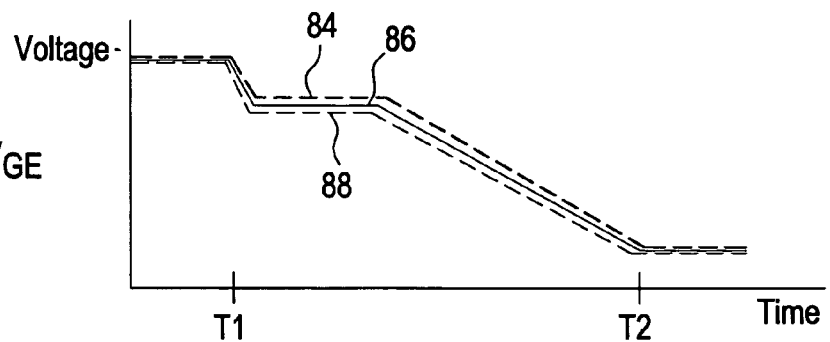
FIG. 2 illustrates first, second, and third voltage signals applied to gate terminals of the first, second, and third IGBTs, respectively, during a switching condition in the electrical switching device of FIG. 1.
Figure 3:
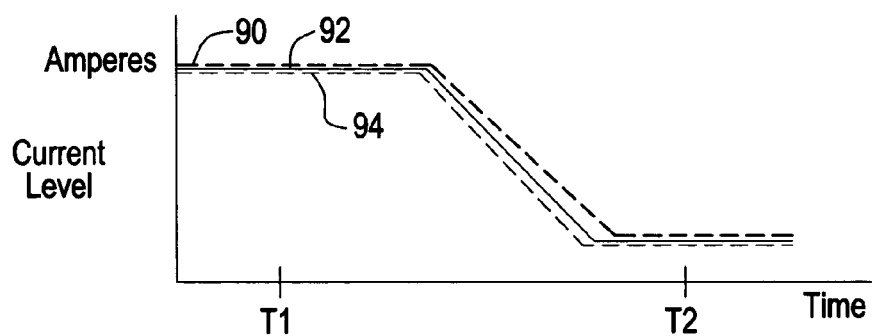
FIG. 3 illustrates first, second, and third electrical currents flowing through first, second, and third IGBTs, respectively, during a switching condition in the electrical switching device of FIG. 1.
Figure 4:
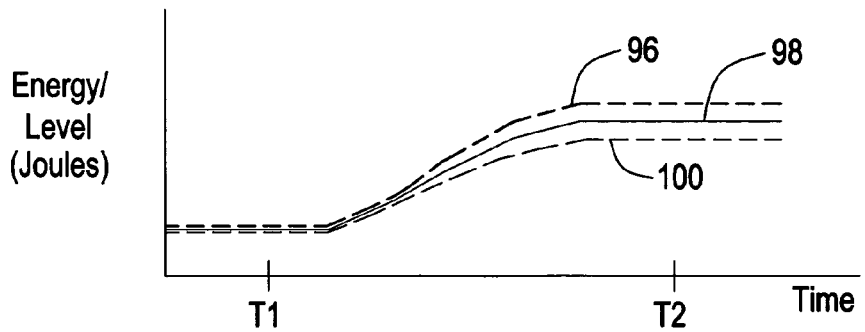
FIG. 4 illustrates first, second, and third energy levels associated with first, second, and third IGBTs, respectively, during a switching condition in the electrical switching device of FIG. 1.
Figure 5:
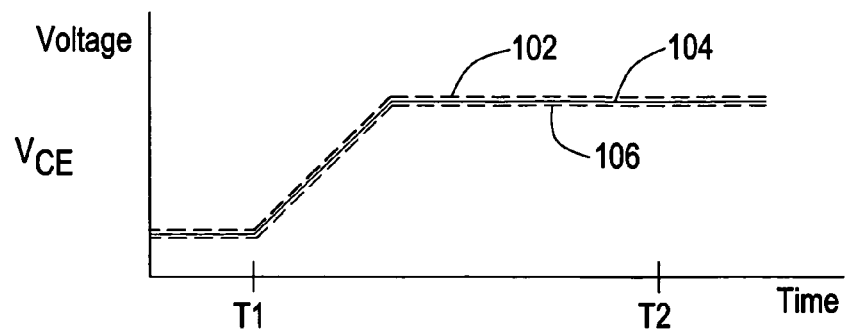
FIG. 5 illustrates first, second, and third collector-to-emitter voltages associated with first, second, and third IGBTs, respectively, during a switching condition in the electrical switching device of FIG. 1.

Referring to FIG. 1, an electrical switching device 10 for supplying electrical balanced electrical currents to a load 64 in accordance with an exemplary embodiment is illustrated. The electrical switching device 10 includes a gate drive circuit 12, IGBTs 14, 16, 18, impedance circuits 50, 52, 54, resistors 58, 60, 62 and a voltage source 63.

The gate drive circuit 12 generates a voltage signal having a positive voltage for turning on the IGBTs 14, 16, 18. In particular, the gate drive circuit 12 generates a voltage signal at the node 66 to turn on the IGBTs 14, 16, 18 such that the IGBTs 14, 16, 18 source electrical currents (I1), (I2), (I3), respectively, to the load 64. Further, the gate drive circuit 12 removes the voltage signal to turn off the IGBTs 14, 16, 18 such that the IGBTs 14, 16, 18 stop sourcing electrical currents (I1), (I2), (I3), respectively, to the load 64. In an exemplary embodiment, the voltage signal is iteratively generated at a predetermined frequency, within a frequency range of 10-100,000 Hertz for example.

The IGBTs 14, 16, 18 are provided to source electrical currents (I1), (I2), (I3) respectively to the load 64. The IGBTs 14, 16, 18 are electrically coupled in parallel between the nodes 76 and 78.

The IGBT 14 includes a gate terminal 20, a collector terminal 22, and an emitter terminal 24. The gate terminal 20 is electrically coupled to a node 70. The collector terminal 22 is electrically coupled to the node 78 which is further electrically coupled to the voltage source 63. When the gate drive circuit 12 generates a voltage signal having a positive voltage at the node 66, a portion of the voltage signal propagates through the resistor 50 to the gate terminal 20 to turn on the IGBT 14. Alternately, when the gate drive circuit 12 does not generate the voltage signal at the node 66, the IGBT 14 is turned off.

The IGBT 16 includes a gate terminal 26, a collector terminal 28, and an emitter terminal 30. The gate terminal 26 is electrically coupled to a node 72. The collector terminal 28 is electrically coupled to the node 78 which is further electrically coupled to the voltage source 63. When the gate drive circuit 12 generates a voltage signal having a positive voltage at the node 66, a portion of the voltage signal propagates through the resistor 52 to the gate terminal 26 to turn on the IGBT 16. Alternately, when the gate drive circuit 12 does not generate the voltage signal at the node 66, the IGBT 16 is turned off.

The IGBT 18 includes a gate terminal 32, a collector terminal 34, and an emitter terminal 36. The gate terminal 32 is electrically coupled to a node 74. The collector terminal 34 is electrically coupled to the node 78 which is further electrically coupled to the voltage source 63. When the gate drive circuit 12 generates a voltage signal having a positive voltage at the node 66, a portion of the voltage signal propagates through the resistor 54 to the gate terminal 32 to turn on the IGBT 18. Alternately, when the gate drive circuit 12 does not generate the voltage signal at the node 66, the IGBT 18 is turned off.

The resistors 58, 60, 62 are provided to maintain a substantially equal voltage (e.g., gate-to-emitter voltage) at each of the gate terminals 20, 26, 32 of the IGBTs 14, 16, 18, respectively. In particular, when the voltage at the gate terminals 20, 26, 32 are respectively are maintained at substantially equal voltages, (e.g., within a 20% range of each other) the currents (I1), (I2), and (I3) sourced by the IGBTs 14, 16, 18, respectively, have a substantially equal value to one other. Further, the amount of energy consumed by the IGBTs 14, 16, 18 during a switching condition are substantially equal to one another. As shown, the resistor 58 is electrically coupled between the gate terminal 20 and a node 68. The resistor 60 is electrically coupled between the gate terminal 26 and the node 68. The resistor 62 is electrically coupled between the gate terminal 32 and the node 68. Each of the resistors 58, 60, 62 can have a resistance in a range of 0.01-10 ohms.

The voltage source 63 is configured to supply an electrical current to the load 64. The voltage source 63 is electrically coupled between the node 78 and the load 64. The load 64 comprises one or more devices or circuit elements having an impedance. As shown, the load 64 is electrically coupled between the voltage source 63 and the node 76.

Referring to FIGS. 2-5, exemplary signal schematics of signals generated by the electrical switching device 10 will be explained. The signal schematics 84, 86, 88 correspond to gate-to-emitter voltages of the IGBTs 14, 16, 18 when the IGBTs are transitioning from an "on" operational state to an "off" operational state over a time interval from time T1 to time T2. As shown, the signal schematics 84, 86, 88 have substantially similar amplitudes indicating that the gate-to-emitter voltages of the IGBTs 14, 16, 18 are substantially equal to one another over the time interval.

The signal schematics 102, 104, 106 correspond to collector-to-emitter voltages of the IGBTs 14, 16, 18 when the IGBTs are transitioning from an "on" operational state to an "off" operational state over the time interval from time T1 to T2. As shown, the signal schematics 102, 104, 106 have substantially similar amplitudes indicating that the collector-to-emitter voltages of the IGBTs 14, 16, 18 are substantially equal to one another over the time interval.

The signal schematics 90, 92, 94 correspond to currents (I1), (I2), (I3), respectively that are sourced by IGBTs 14, 16, 18, respectively when the IGBTs are transitioning from the "on" operational state to the "off" operational state over the time interval from time T1 to time T2. As shown, the signal schematics 90, 92, 94 have substantially similar amplitudes indicating that the currents (I1), (I2), (I3), are substantially equal to one another over the time interval.

The signal schematics 96, 98, 100 correspond to energy levels of the IGBTs 14, 16, 18 when the IGBTs are transitioning from the "on" operational state to the "off" operational state over the time interval from time T1 to time T2. As shown, the signal schematics 96, 98, 100 have substantially similar amplitudes indicating the energy utilized by the IGBTs are substantially equal to one another over the time interval.

In an alternative embodiment, the IGBTs 14, 16, 18 in electrical switching device 10 can be replaced with first, second, and third MOSFETs, respectively. In particular, the gate terminal of the first MOSFET would be electrically coupled to the node 70. Further, the emitter terminal of the first MOSFET would be electrically coupled to the node 76. Further, the collector terminal of the first MOSFET would be electrically coupled to the node 78. Further, the gate terminal of the second MOSFET would be electrically coupled to the node 72. The emitter terminal of the second MOSFET would be electrically coupled to the node 76. The collector terminal of the second MOSFET would be electrically coupled to the node 78. Further, the gate terminal of the third MOSFET would be electrically coupled to the node 74. The emitter terminal of the third MOSFET would be electrically coupled to the node 76. The collector terminal of the third MOSFET would be electrically coupled to the node 78.

Figure 6:
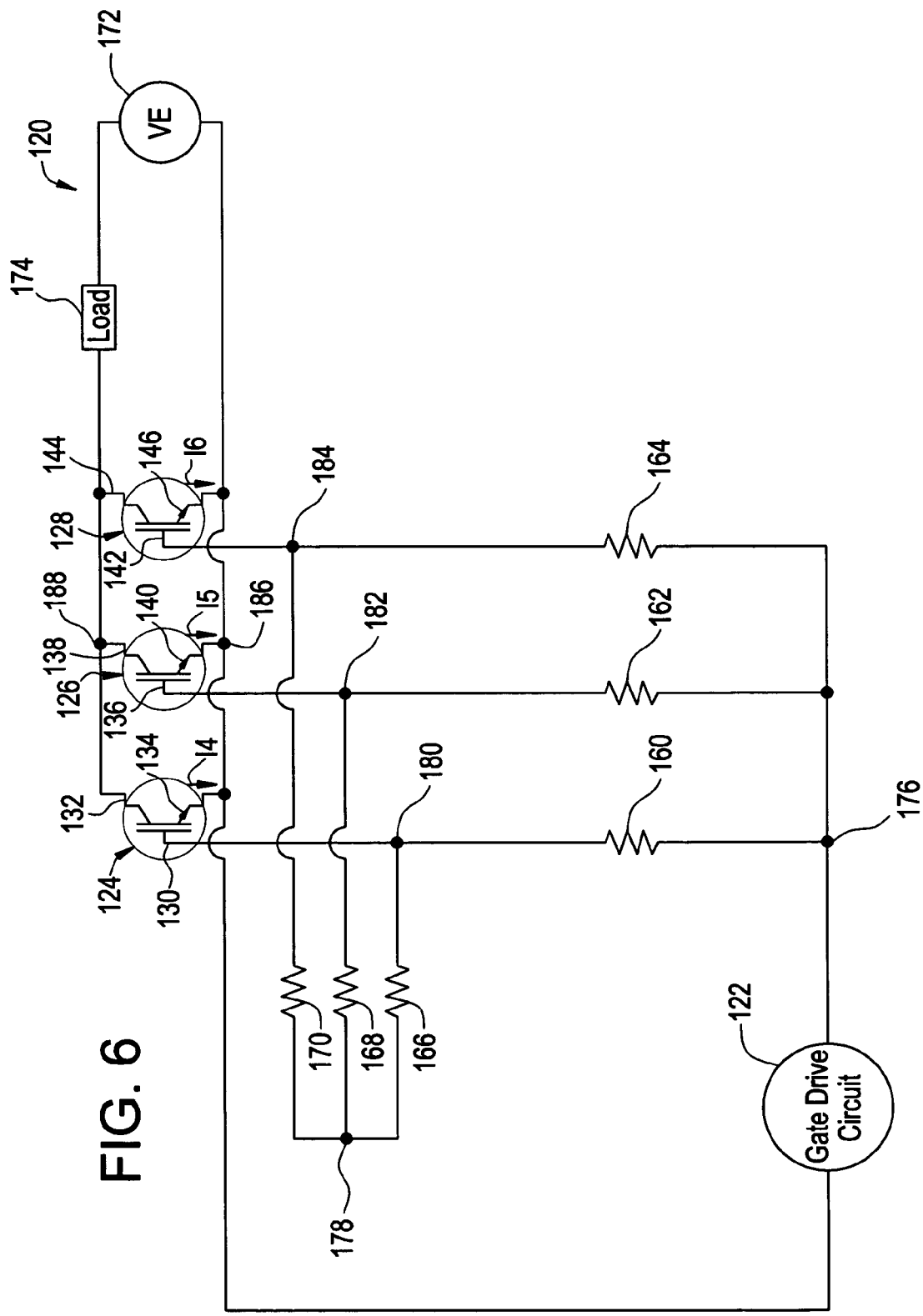
FIG. 6 illustrates an electrical switching device in accordance with another exemplary embodiment.

Referring to FIG. 6, an electrical switching device 120 for supplying balanced electrical currents to a load 174 in accordance with another exemplary embodiment is illustrated. The electrical switching device 120 includes a gate drive circuit 122, metal oxide semiconductor field-effect transistors (MOSFETs) 124, 126, 128, impedance circuits 160, 162, 164, resistors 166, 168, 170, and a voltage source 172.

The gate drive circuit 122 generates a voltage signal having a positive voltage for turning on the MOSFETs 124, 126, 128. In particular, the gate drive circuit 122 generates a voltage signal having the positive voltage at the node 176 to turn on the MOSFETs 124, 126, 128 such that the MOSFETs 124, 126, 128 source electrical currents (I4), (I5), (I6), respectively, to the load 174. Further, the gate drive circuit 122 removes the voltage signal at the node 176 to turn off the MOSFETs 124, 126, 128 such that the MOSFETs 124, 126, 128 stop sourcing electrical currents (I4), (I5), (I6), respectively, to the load 174.

The MOSFETs 124, 126, 128 are provided to source electrical currents (I4), (I5), (I6) respectively to the load 174. The MOSFETs 124, 126, 128 are electrically coupled in parallel between the nodes 186 and 188.

The MOSFET 124 includes a gate terminal 130, a source terminal 132, and a drain terminal 134. The gate terminal 130 is electrically coupled to a node 180. The source terminal 132 is electrically coupled to the node 188 which is further electrically coupled to the load 174. The drain terminal 134 is electrically coupled to the node 186. When the gate drive circuit 122 generates a voltage signal having a positive voltage at the node 176, a portion of the voltage signal propagates through the resistor 160 to the gate terminal 130 to turn on the MOSFET 124. Alternately, when the gate drive circuit 122 does not generate the voltage signal at the node 176, the MOSFET 124 is turned off The MOSFET 126 includes a gate terminal 136, a source terminal 138, and a drain terminal 140. The gate terminal 136 is electrically coupled to a node 182. The source terminal 138 is electrically coupled to the node 188 which is further coupled to the load 174. The drain terminal 140 is electrically coupled to the node 186. When the gate drive circuit 122 generates a voltage signal having a positive voltage at the node 176, a portion of the voltage signal propagates through the resistor 162 to the gate terminal 136 to turn on the MOSFET 126. Alternately, when the gate drive circuit 122 does not generate the voltage signal at the node 176, the MOSFET 126 is turned off.

The MOSFET 128 includes a gate terminal 142, a source terminal 144, and a drain terminal 146. The gate terminal 142 is electrically coupled to a node 184. The source terminal 144 is electrically coupled to the node 188 which is further electrically coupled to the load 174. The drain terminal 146 is electrically coupled to the node 186. When the gate drive circuit 122 generates a voltage signal having a positive voltage at the node 176, a portion of the voltage signal propagates through the resistor 164 to the gate terminal 142 to turn on the MOSFET 128. Alternately, when the gate drive circuit 122 does not generate the voltage signal at the node 176, the MOSFET 128 is turned off.

The resistors 166, 168, 170 are provided to maintain a substantially equal voltage (e.g., drain-to source voltage) at each of the gate terminals 130, 136, 142 of the MOSFETs 124, 126, 128, respectively. In particular, when the voltage at the gate terminals 130, 136, 142 are maintained at substantially equal voltages, the currents (I4), (I5), and (I6) sourced by the MOSFETs 124, 126, 128, respectively, have a substantially equal value to one other. Further, the amount of energy consumed by the MOSFETs 124, 126, 128 during a switching condition are substantially equal to one another. As shown, the resistor 166 is electrically coupled between the gate terminal 130 and a node 178. The resistor 168 is electrically coupled between the gate terminal 136 and the node 178. The resistor 170 is electrically coupled between the gate terminal 142 and the node 178.

The voltage source 172 is configured to supply an electrical current to the load 174. The voltage source 172 is electrically coupled between the load 174 and the node 186. The load 174 comprises one or more devices or circuit elements having an impedance. As shown, the load 174 is electrically coupled between the voltage source 172 and the node 188.

In an alternative embodiment, the MOSFETs 124, 126, 128 in electrical switching device 120 can be replaced with first, second, and third IGBTs respectively. In particular, a gate terminal of the first IGBT would be electrically coupled to the node 180. A drain terminal of the first IGBT would be electrically coupled to the node 186. A source terminal of the first IGBT would be electrically coupled to the node 188. Further, a gate terminal of the second IGBT would be electrically coupled to the node 182. A drain terminal of the second IGBT would be electrically coupled to the node 186. A source terminal of the second IGBT would be electrically coupled to the node 188. Further, a gate terminal of the third IGBT would be electrically coupled to the node 184. A drain terminal of the third IGBT would be electrically coupled to the node 186. A source terminal of the third IGBT would be electrically coupled to the node 188.

The inventive electrical switching devices provide a substantial advantage over other switching devices. In particular, the electrical switching devices provide technical effect of balancing currents sourced by multiple IGBTs or MOSFETs to a load.

While the invention is described with reference to an exemplary embodiment, it will be understood by those skilled in the art that various changes may be made and equivalence may be substituted for elements thereof without departing from the scope of the invention. In addition, many modifications may be made to the teachings of the invention to adapt to a particular situation without departing from the scope thereof. Therefore, it is intended that the invention not be limited to the embodiment disclosed for carrying out this invention, but that the invention includes all embodiments falling with the scope of the intended claims. Moreover, the use of the term's first, second, etc. does not denote any order of importance, but rather the term's first, second, etc. are used to distinguish one element from another.

The invention claimed is:

1. An electrical switching device, comprising:
    a drive circuit generating a voltage signal;
    a first IGBT having a first gate terminal, a first collector terminal, and a first emitter terminal, the first gate terminal receiving the voltage signal from the drive circuit via a first resistor coupled between the drive circuit and the first gate terminal, the first collector terminal coupled to a voltage source;
    a second IGBT having a second gate terminal, a second collector terminal, and a second emitter terminal, the second emitter terminal coupled to the first emitter terminal, the second gate terminal receiving the voltage signal from the drive circuit via a second resistor coupled between the drive circuit and the second gate terminal, the second collector terminal coupled to the first collector terminal;
    a third resistor coupled between the first gate terminal of the first IGBT and a node; and
    a fourth resistor coupled between the second gate terminal of the second IGBT and the node, such that when the first and second gate terminals receive the voltage signal from the drive circuit via the first and second resistors, respectively, an amplitude of a first voltage between the first gate terminal and the first emitter terminal is substantially equal to a second voltage between the second gate terminal and the second emitter terminal, resulting in a first current flowing from the first emitter terminal of the first IGBT to a load to be substantially equal to a second current flowing from the second emitter terminal of the second IGBT to the load;
    a third IGBT having a third gate terminal, a third collector terminal, and a third emitter terminal, the third emitter terminal coupled to the second emitter terminal, the third gate terminal receiving the voltage signal from the drive circuit via a fifth resistor coupled between the drive circuit and third gate terminal, the third collector terminal coupled to the second collector terminal; and
    a sixth resistor coupled between the third gate terminal of the third IGBT and the node, such that when the first, second, and third gate terminals receive the voltage signal from the drive circuit via the first, second, and third resistors, respectively, an amplitude of the first voltage between the first gate terminal and the first emitter terminal is substantially equal to both the second voltage between the second gate terminal and the second emitter terminal and a third voltage between the third gate terminal and the third emitter terminal, resulting in the first current flowing from the first emitter terminal of the first IGBT to the load to be substantially equal to both the second current flowing from the second emitter terminal of the second IGBT to the load, and a third current flowing from the third emitter terminal of the third IGBT to the load.

2. The electrical switching device of claim 1, wherein the third and fourth resistors have a resistance in a range of 0.01-10 ohms.

3. The electrical switching device of claim 1, wherein the voltage signal has a frequency of 10-100,000 Hertz.

4. The electrical switching device of claim 1, wherein first and second amounts of electrical energy utilized by the first IGBT and the second IGBT, respectively, during a switching condition are substantially equal to each other.

5. An electrical switching device, comprising:
    a drive circuit generating a voltage signal;
    a first IGBT having a first gate terminal, a first collector terminal, and a first emitter terminal, the first gate terminal receiving the voltage signal from the drive circuit via a first resistor coupled between the drive circuit and the first gate terminal, the first collector terminal coupled to a load;
    a second IGBT having a second gate terminal, a second collector terminal, and a second emitter terminal, the second emitter terminal coupled to the first emitter terminal, the second gate terminal receiving the voltage signal from the drive circuit via a second resistor coupled between the drive circuit and the second gate terminal, the second collector terminal coupled to the first collector terminal;
    a third resistor coupled between the first gate terminal of the first IGBT and a node; and
    a fourth resistor coupled between the second gate terminal of the second IGBT and the node, such that when the first and second gate terminals receive the voltage signal from the drive circuit via the first and second resistors, respectively, an amplitude of a first voltage between the first gate terminal and the first emitter terminal is substantially equal to a second voltage between the second gate terminal and the second emitter terminal, resulting in a first current flowing from the first emitter terminal of the first IGBT to a voltage source to be substantially equal to a second current flowing from the second emitter terminal of the second IGBT to the voltage source;
    a third IGBT having a third gate terminal, a third collector terminal, and a third emitter terminal, the third emitter terminal coupled to the second emitter terminal, the third gate terminal receiving the voltage signal from the drive circuit via a fifth resistor coupled between the drive circuit and third gate terminal, the third collector terminal coupled to the second collector terminal; and
    a sixth resistor coupled between the third gate terminal of the third IGBT and the node, such that when the first, second, and third gate terminals receive the voltage signal from the drive circuit via the first, second, and third resistors, respectively, an amplitude of the first voltage between the first gate terminal and the first emitter terminal is substantially equal to both the second voltage between the second gate terminal and the second emitter terminal and a third voltage between the third gate terminal and the third emitter terminal, resulting in the first current flowing from the first emitter terminal of the first IGBT to the voltage source to be substantially equal to both the second current flowing from the second emitter terminal of the second IGBT to the voltage source, and a third current flowing from the third emitter terminal of the third IGBT to the voltage source.

6. An electrical switching device, comprising:
a drive circuit generating a voltage signal;
a first MOSFET having a first gate terminal, a first source terminal, and a first drain terminal, the first gate terminal receiving the voltage signal from the drive circuit via a first resistor coupled between the drive circuit and the first gate terminal, the first source terminal coupled to a voltage source;
a second MOSFET having a second gate terminal, a second source terminal, and a second drain terminal, the second drain terminal coupled to the first drain terminal, the second gate terminal receiving the voltage signal from the drive circuit via a second resistor coupled between the drive circuit and the second gate terminal, the second source terminal coupled to the first source terminal;
a third resistor coupled between the first gate terminal of the first MOSFET and a node; and
a fourth resistor coupled between the second gate terminal of the second MOSFET and the node, such that when the first and second gate terminals receive the voltage signal from the drive circuit via the first and second resistors, respectively, an amplitude of a first voltage between the first gate terminal and the first drain terminal is substantially equal to a second voltage between the second gate terminal and the second drain terminal, resulting in a first current flowing from the first drain terminal of the first MOSFET to a load to be substantially equal to a second current flowing from the second drain terminal of the second MOSFET to the load;
a third MOSFET having a third gate terminal, a third collector terminal, and a third emitter terminal, the third gate terminal receiving the voltage signal from the drive circuit via a fifth resistor coupled between the drive circuit and the third gate terminal, the third collector terminal coupled to the second collector terminal; and
a sixth resistor coupled between the third gate terminal of the third MOSFET and the node, such that when the first, second, and third gate terminals receive the voltage signal from the drive circuit via the first, second, and third resistors, respectively, an amplitude of the first voltage between the first gate terminal and the first drain terminal is substantially equal to both the second voltage between the second gate terminal and the second drain terminal and a third voltage between the third gate terminal and the third emitter terminal, resulting in the first current flowing from the first drain terminal of the first MOSFET to the load to be substantially equal to both the second current flowing from the second drain terminal of the second MOSFET to the load, and a third current flowing from the third emitter terminal of the third MOSFET to the load.

7. The electrical switching device of claim 6, wherein the third and fourth resistors have a resistance in a range of 0.01-10 ohms.

8. The electrical switching device of claim 6, wherein the voltage signal has a frequency of 10-100,000 Hertz.

9. The electrical switching device of claim 6, wherein first and second amounts of electrical energy utilized by the first MOSFET and the second MOSFET, respectively, during a switching condition are substantially equal to each other.

10. An electrical switching device, comprising:
a drive circuit generating a voltage signal;
a first MOSFET having a first gate terminal, a first source terminal, and a first drain terminal, the first gate terminal receiving the voltage signal from the drive circuit via a first resistor coupled between the drive circuit and the first gate terminal, the first source terminal coupled to a load;
a second MOSFET having a second gate terminal, a second source terminal, and a second drain terminal, the second drain terminal coupled to the first drain terminal, the second gate terminal receiving the voltage signal from the drive circuit via a second resistor coupled between the drive circuit and the second gate terminal, the second source terminal coupled to the first source terminal;
a third resistor coupled between the first gate terminal of the first MOSFET and a node; and
a fourth resistor coupled between the second gate terminal of the second MOSFET and the node, such that when the first and second gate terminals receive the voltage signal from the drive circuit via the first and second resistors, respectively, an amplitude of a first voltage between the first gate terminal and the first drain terminal is substantially equal to a second voltage between the second gate terminal and the second drain terminal, resulting in a first current flowing from the first drain terminal of the first MOSFET to a voltage source to be substantially equal to a second current flowing from the second drain terminal of the second MOSFET to the voltage source;
a third MOSFET having a third gate terminal, a third collector terminal, and a third emitter terminal, the third gate terminal receiving the voltage signal from the drive circuit via a fifth resistor coupled between the drive circuit and the third gate terminal, the third collector terminal coupled to the second collector terminal; and
a sixth resistor coupled between the third gate terminal of the third MOSFET and the node, such that when the first, second, and third gate terminals receive the voltage signal from the drive circuit via the first, second, and third resistors, respectively, an amplitude of the first voltage between the first gate terminal and the first drain terminal is substantially equal to both the second voltage between the second gate terminal and the second drain terminal and a third voltage between the third gate terminal and the third emitter terminal, resulting in the first current flowing from the first drain terminal of the first MOSFET to the voltage source to be substantially equal to both the second current flowing from the second drain terminal of the second MOSFET to the voltage source, and a third current flowing from the third emitter terminal of the third MOSFET to the voltage source.

* * * * *